United States Patent
Jung et al.

(10) Patent No.: US 6,838,926 B2
(45) Date of Patent: Jan. 4, 2005

(54) FUSE CIRCUIT FOR SEMICONDUCTOR INTEGRATED CIRCUIT

(75) Inventors: Chang-Whan Jung, Seoul (KR); Eun-Han Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 09/879,637

(22) Filed: Jun. 12, 2001

(65) Prior Publication Data

US 2002/0044006 A1 Apr. 18, 2002

(30) Foreign Application Priority Data

Oct. 18, 2000 (KR) ........................................ 2000-61257

(51) Int. Cl.⁷ .............................................. H01H 37/76
(52) U.S. Cl. .................................... 327/525; 365/225.7
(58) Field of Search ................................ 327/525, 574, 327/575; 365/200, 225.7, 112, 115, 189.01; 714/725

(56) References Cited

U.S. PATENT DOCUMENTS

| | | | | | |
|---|---|---|---|---|---|
| 5,469,388 A | * | 11/1995 | Park | ........................... | 365/200 |
| 5,469,391 A | * | 11/1995 | Haraguchi | ................... | 365/200 |
| 5,517,151 A | * | 5/1996 | Kubota | ........................ | 327/514 |
| 5,576,999 A | * | 11/1996 | Kim et al. | ................... | 365/200 |
| 5,677,917 A | | 10/1997 | Wheelus et al. | ............ | 714/726 |
| 5,933,382 A | * | 8/1999 | Yi et al. | ................... | 365/225.7 |
| 6,026,037 A | * | 2/2000 | Hong | .......................... | 365/200 |

* cited by examiner

*Primary Examiner*—Minh Nguyen
(74) *Attorney, Agent, or Firm*—Mills & Onello

(57) ABSTRACT

In a fuse circuit including programmable fuses in a semiconductor integrated circuit, the fuses store specific information related to the semiconductor integrated circuit, such as redundancy information, wafer lot number, die lot number, and die position on the wafer, etc. The fuse circuit utilizes a plurality of fuses for storing identical bit information. Consequently, in the case where a fuse has not been cut out correctly, the fuse circuit can reduce programming defects, whereby defect generation rates are remarkably decreased.

12 Claims, 2 Drawing Sheets

FUSE CIRCUIT FOR SEMICONDUCTOR INTEGRATED CIRCUIT

This application relies for priority upon Korean Patent Application No. 2000-61257, filed on Oct. 18, 2000, the contents of which are herein incorporated by reference in their entirety.

FIELD OF THE INVENTION

The present invention relates generally to semiconductor integrated circuit devices, and more particularly to a fuse circuit employed in a semiconductor integrated circuit.

BACKGROUND OF THE INVENTION

As the storage capacity of integrated circuit memories continues to increase through higher integration, associated memory cell defects rise accordingly, due to increased complexity in manufacturing processes, leading to degradation of production yield. In general, it is difficult to render a memory device having no defective cells. Therefore, various attempts have been made to improve the production yields of the highly integrated memory devices.

It is preferable to improve the manufacturing process to suppress the generation of the defective cells; but there are limitations. Thus, other ways for improving production yields in large integrated circuit memories have been proposed. One of the ways for enhancing production yield is a redundancy technique for which a constitution of the memory device is designed to repair defective regions born therein during the manufacturing process. According to the redundancy technique, a main memory cell array for storing binary data is arranged together with an array formed of redundant memory cells to implement the defective cells in rows and columns.

In general, a redundant cell array can be classified as a row redundant array for substituting defective cells in rows, or as a column redundant array for substituting defective cells in columns. Substituting the defective cells with redundant cells is accomplished by storing defective addresses, i.e. information on positions of the defective cells, and by determining whether or not the defective addresses are identical with external addresses. Such circuits, along with the redundant cell array, compose a redundancy circuit, providing a memory device capable of operating normally, free from invalid operations due to the defective cells.

In a memory device having the redundancy circuit, evaluation of production yield requires detection of detect whether a redundant array is utilized. A technique for storing the repair information is disclosed in U.S. Pat. No. 5,677, 917 entitled "Integrated Circuit Memory Using Fusible Links In A Scan Chain" by Wheelus et. Al. on Oct. 14, 1997.

FIG. 1 is a schematic diagram of a fuse circuit disclosed in Wheelus. Referring to FIG. 1, the fuse circuit is formed of a fuse 10, N-channel metal-oxide semiconductor (NMOS) transistors 12 and 14, and inverters 16 and 18. The fuse 10 is made of polysilicon that is able to be cut out, or otherwise opened, by a laser, and connected between power supply voltage VDD and sensing node 15. The NMOS transistor 12 has a gate coupled to the power supply voltage VDD, and connects the sensing node 15 to ground voltage VSS. The NMOS transistor 14 is connected between the sensing node 15 and the ground voltage VSS. The sensing node 15 is connected to the output terminal of the fuse circuit through inverters 16 and 18. The gate of the NMOS transistor 14 is coupled to output of inverter 16 (and input of the inverter 18). Inverter 16 is connected to drain of NMOS transistors 12 and 14, and to the gate of NMOS transistor 14. Inverter 18 is connected to the output terminal of inverter 16, and provides output signal D.

Operation of the fuse circuit shown in FIG. 1 is described as follows. When the fuse 10 connects the power supply voltage VDD to the sensing node 15 so as to set the output signal D into a high level (i.e., the fuse 10 is not cut out), the power supply voltage VDD is applied to the input terminal of the inverter 16, and then the inverter 16 provides low level. Thus, the NMOS transistor 14 maintains a non-conductive state, and the inverter 18 provides the signal D at a high level. Meanwhile, if the fuse 10 does not connect the power supply voltage VDD to the sensing node 15, so as to set the output signal D into low level (i.e., the fuse 10 is cut out), NMOS transistor 12 pulls an output voltage of the inverter 16 down to low level. That is, the NMOS transistor 12 operates as a pull-down transistor. The inverter 16 applies a signal of high level to the gate of NMOS transistor 14 and the input terminal of the inverter 18. Thus, NMOS transistor 14 becomes conductive to lower the input terminal of the inverter 16 down to low level, and thereby the inverter 18 generates the output signal D at a low level.

As described above, a voltage level of the output signal D generated from the conventional fuse circuit is dependent upon a programmed state on the fuse 10, i.e. whether or not the fuse 10 is cut out. As semiconductor memory device density is increased to scale down topological size of circuit elements including the fuses, the cut out technique for the fuses becomes more and more of a challenge. An incorrect (or failed) cut out of the fuses results in an invalid programming in the fuse circuit, causing degradation of the production yield.

SUMMARY OF THE INVENTION

It is therefore an object of the present invention to provide a fuse circuit embedded in semiconductor integrated circuits capable of reducing programming defects, even in the case where a fuse has not been cut out correctly.

In order to attain the above objects, according to an aspect of the present invention, there is provided a fuse circuit of a semiconductor integrated circuit, including a plurality of fuses and a plurality of transmission circuits for transferring signals in response to fuse status.

The plurality of fuses have an identical fusing status. Each fuse includes two ends in which one end is connected to power supply voltage.

The transmission circuits correspond to the fuses, and each of which includes: a transmission gate having an input terminal, an output terminal, a primary control terminal connected to the other end of a corresponding fuse, and a secondary control terminal; and an inverter having an input terminal connected to the other end of the corresponding fuse and the primary control terminal, and an output terminal connected to the secondary control terminal.

Here, the transmission gate includes: a first conductive transistor having a first electrode connected to the input terminal, a control electrode connected to the other end of the corresponding fuse, and a second electrode connected to the output terminal; and a second conductive transistor having a second electrode connected to the input terminal, a control electrode connected to the output terminal of the inverter, and a first electrode connected to the output terminal. Power supply voltage may be applied to the input terminal.

Each of the transmission circuits further comprises a resistor where one end is connected to the control electrode of the first conductive transistor and the input terminal of the inverter, and the other end is connected to the power supply voltage.

The fuse circuit of the invention includes programmable fuses which store the specific information of the semiconductor integrated circuit such as redundancy information, wafer lot number, die lot number, and die position on the wafer, etc. The fuse circuit in the present invention utilizes a plurality of fuses for storing identical bit information.

According to the fuse circuit of the invention, the fuse circuit is able to reduce programming defects, even in cases where the fuses have not been cut out correctly. Thereby, defect generation rates are remarkably decreased.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The present invention will be described by way of exemplary embodiments, not to be construed as limitations, illustrated in the accompanying drawings in which like references denote similar elements, and in which.

DETAILED DESCRIPTION OF PREFERRED EMBODIMENTS

It should be understood that the following description of preferred embodiments is merely illustrative and that it should not be taken in a limiting sense. In the following detailed description, several specific details are set forth in order to provide a thorough understanding of the present invention. It will be apparent, however, to one skilled in the art, that the present invention may be practiced without these specific details.

Figure 2:
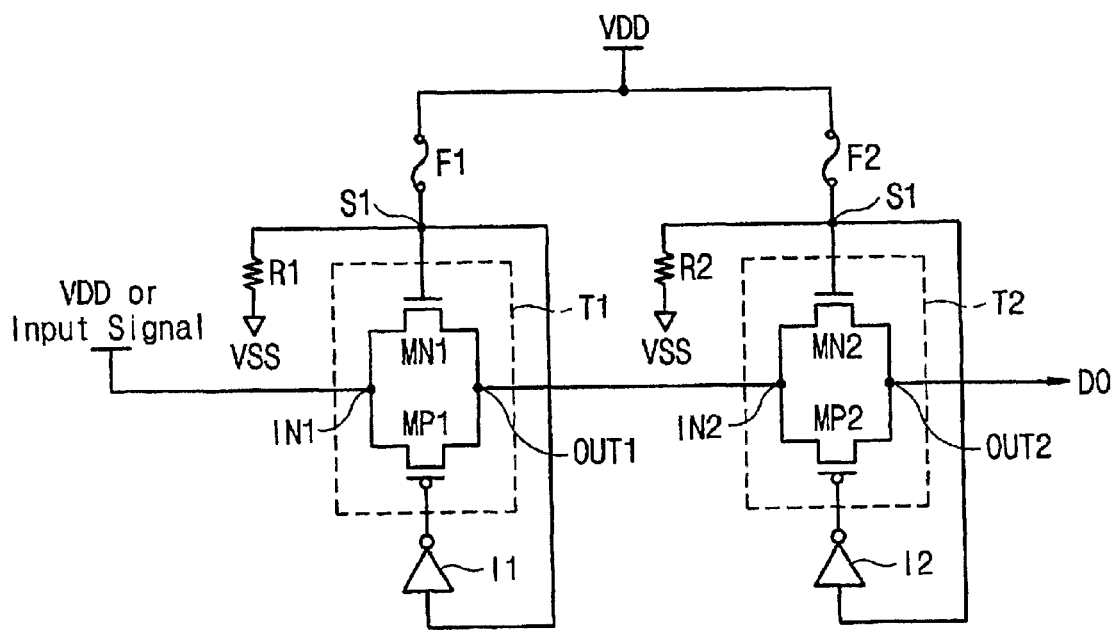
FIG. 2 is a circuit diagram of a fuse circuit according to an embodiment of the present invention.

FIG. 2 is a circuit diagram of a fuse circuit according to an embodiment of the present invention Referring to FIG. 2, the fuse circuit is formed of fuses F1 and F2, transmission gates T1 and T2, inverters I1 and I2, and resistors R1 and R2. The fuses F1 and F2 are made of polysilicon, or other metallic materials such as titanium (Ti) or titanium nitride (TiN) that can be cut out by a laser. Each of the fuses F1 and F2 is connected between power supply voltage VDD and sensing nodes S1 and S2. The transmission gate T1 is connected to the fuse F1, and includes an input terminal IN1 connected to the power supply voltage VDD or an input signal, and an output terminal OUT1. The other transmission gate T2 is connected to the fuse F2, and includes an input terminal IN2 connected to the output terminal OUT1 of the gate T1, and an output terminal OUT 2 providing an output signal DO.

More specifically, the transmission gate T1 is formed of a first N-channel metal-oxide semiconductor (MOS) transistor MN1 and a first P-channel MOS transistor MP1. The first NMOS transistor MN1 is connected to a sensing node S1, the input terminal IN1, and the output terminal OUT 1. The first PMOS transistor MP1 is connected to the input terminal IN1 and the output terminal OUT1, and output terminal of the invert I1. The transmission gate T2 includes a second NMOS transistor MN2 and a second PMOS transistor MP2. The second NMOS transistor MN2 is connected to the input terminal IN2, the sensing node S2, and the output terminal OUT2. The second PMOS transistor MP2 is connected to the input terminal IN2, the output terminal OUT2, and output terminal of the inverter I2.

The inverter I1 is connected to the sensing node S1 and the gate of the first PMOS transistor PM1. The inverter I2 is connected to the sensing node S2 and the gate of the second PMOS transistor MP2.

The resistor R1 includes two ends in which one end is connected to the sensing node S1, and the other end is connected to ground voltage VSS. The resistor R2 includes two ends in which one end is connected to the sensing node S2, and the other end is connected to the ground voltage VSS.

The fuse circuit having the foregoing configuration stores one bit of the specific information of the semiconductor integrated circuit, and the fuses F1 and F2 are established in the identical status substantially. Briefly, the output signal DO is programmed to high level when the fuses F1 and F2 are not cut out, while the output signal DO is programmed to low level when the fuses F1 and F2 are cut out.

When both the fuses F1 and F2 are not cut out to establish high-leveled programmed status, the power supply voltage VDD is applied to the gate of the first NMOS transistor MN1 and to the input terminal of the inverter I1, through the fuse F1, and then the inverter I1 generates low level. Thus, the transmission gate T1 is enabled, so that the power supply voltage VDD or an input signal applied to the input terminal IN1 is transferred to the output terminal OUT1. Meanwhile, the power supply voltage VDD is applied to the gate of the second NMOS transistor MN2 and to the input terminal of the inverter I2, through the fuse F2, and then the inverter I2 generates low level. Similarly, if both fuses F1 and F2 connect the power supply voltage VDD to the sensing nodes S1 and S2 to set the output signal DO into high level, the power supply voltage VDD, or an input signal, is provided to the output signal DO by way of the transmission gates T1 and T2.

When both the fuses F1 and F2 are cut out to establish low-leveled programmed status, the gates of the first and second NMOS transistors MN1 and MN2, and the input terminals of the inverters I1 and I2 are respectively connected to the ground voltage VSS through the resistors R1 and R2. Thus, the transmission gates T1 and T2 are disabled, so that the signals provided from the input terminals thereof are not transferred to the output terminals.

The resistors R1 and R2, having large resistance values, prevent the gates of the NMOS transistors MN1 and MN2, and the input terminals of the inverters I1 and I2 from being situated in floating states.

If only one of the two fuses F1, F2, e.g., fuse F1, is cut out, the operation is as follows. Due to the fuse F1 being cut out, the gate of the first NMOS transistor MN1 and the input terminal of the inverter I1 are connected to the ground voltage VSS through resistor R1. Thus, the transmission gate T1 does not transfer an input signal provided through the input terminal IN1 to the output terminal OUT1. While, as the fuse F2 is not cut out, the power supply voltage VDD is applied to the gate of the second NMOS transistor MN2 and to the input terminal of the inverter I2. Thus, the transmission gate T2 provides an input signal provided through the input terminal IN2 to the output terminal OUT2. However, the power supply voltage VDD or the input signal is not provided as the output signal DO because of the transmission gate T1 being disabled.

The conventional fuse circuit storing specific information of the semiconductor integrated circuit stores only one-bit information in one fuse. Therefore, if the fuse is supposed to be cut, but is not, the output signal becomes invalid to cause a malfunction for mode establishment, and there is no way to correct to the disorder.

Figure 1:
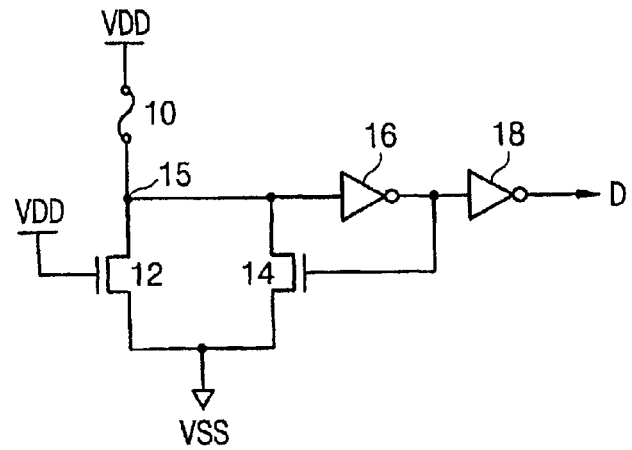
FIG. 1 is a schematic diagram of a conventional fuse circuit.

However, the fuse circuit of the present invention employs two redundant fuses F1 and F2 to store the one-bit information. If at least one of the fuses F1 and F2 is cut out, the input signal is not provided as the output signal. Hence, the process of fuse cutting is considered to be accomplished with substantial mitigation of, or complete elimination of, error. In other words, the fuse circuit of the present invention reduces defect generation rates for defects arising from the process of fuse cutting, as compared to the defect rates in conventional fuse configurations (FIG. 1) that are dependent on proper cutting of a single, unique fuse.

While the fuse circuit shown in FIG. 2 is used for storing one-bit information, it is possible to increment the number of the fuse circuits (e.g., N-numbered fuse circuits) in order to store a multiplicity of information bits (e.g., N-bit information)

Figure 3:
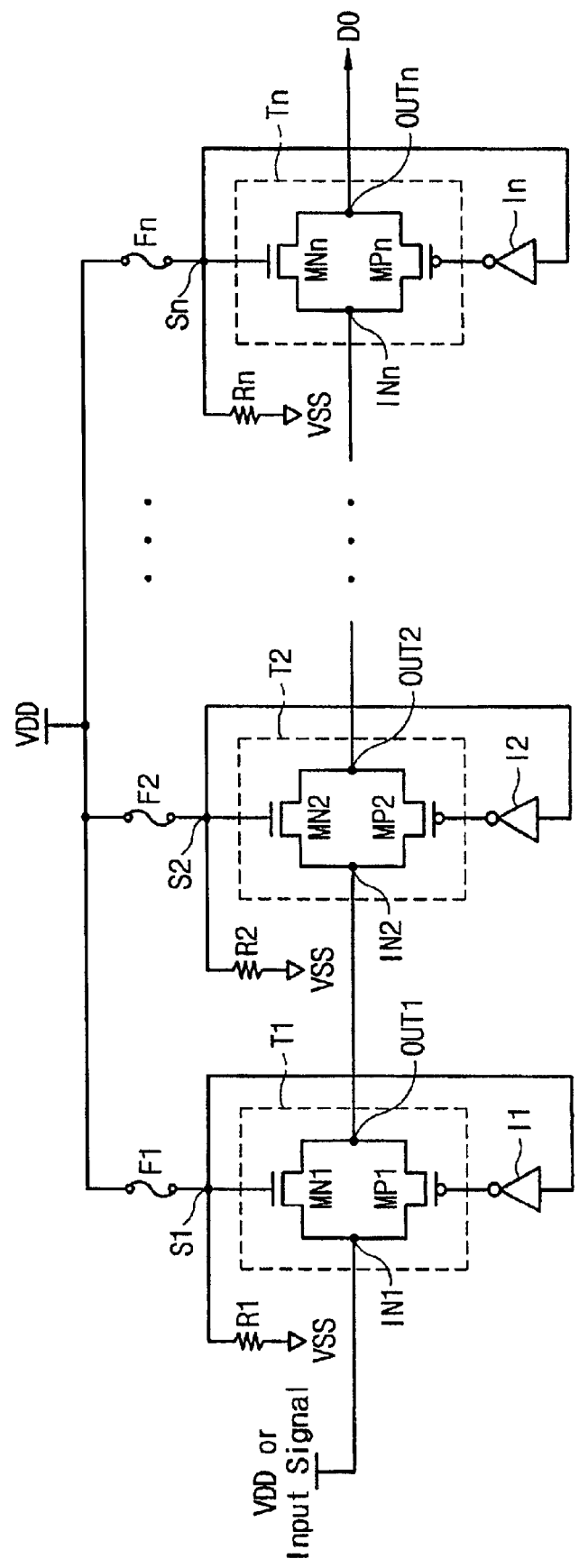
FIG. 3 is a circuit diagram showing a plurality of fuse circuits storing specific information of one-bit of a semiconductor integrated circuit according to another embodiment of the present invention.

FIG. 3 is a circuit diagram showing a plurality of fuse circuits storing specific information of one-bit of the semiconductor integrated circuit according to another embodiment of the present invention. In the fuse circuit shown in FIG. 3, a plurality of fuses F1 through Fn store the identical bit information. Comparing to the fuse circuit employing two fuses F1 and F2 shown FIG. 2, the plurality of fuses F1~Fn reduce the error generation rates even further.

According to the present invention, in a fuse circuit storing the specific information of the semiconductor integrated circuit, programming defects arising from the process of cutting of fuses can be reduced.

Numerous modifications and variations of the present invention are possible in light of the above teachings. It is therefore to be understood that, within the scope of the appended claims, the present invention can be practiced in a manner other than as specifically described herein.

What is claimed is:

1. A fuse circuit for a semiconductor integrated circuit, comprising:
   a plurality of fuses; and
   a like plurality of transmission circuits, each of the plurality of fuses being coupled to only one corresponding transmission circuit of the plurality of transmission circuits; each transmission circuit having a single input at an input node and a single output at an output node for transferring signals from the input node to the output node in response to a status of the corresponding fuse, the input and output nodes of respective transmission circuits being coupled such that the transmission circuits are arranged in series, such that an input signal applied to the input node of a first transmission circuit in the series is transferred to the output node of a last transmission circuit in the series when all of the transmission circuits in the series are in an active state and such that the input signal is not transferred from the input node of the first transmission circuit to the output node of the last transmission circuit in the series when at least one of the transmission circuits in the series is in an inactive state.

2. The fuse circuit of claim 1, wherein each fuse in the plurality of fuses has an identical fusing status.

3. The fuse circuit of claim 1, wherein each of the fuses includes first and second terminals, the first terminal of each being connected to a first power supply voltage.

4. The fuse circuit of claim 3, wherein each of the transmission circuits comprises:
   a transmission gate having an input terminal coupled to a corresponding input node, an output terminal coupled to a corresponding output node, and a primary control terminal connected to the second terminal of the corresponding fuse, and a secondary control terminal; and
   an inverter having an input terminal connected to the second terminal of the corresponding fuse and the primary control terminal, and having an output terminal connected to the secondary control terminal.

5. The fuse circuit of claim 4, wherein the transmission gate includes:
   a first conductive transistor having a first electrode connected to the input terminal, a control electrode connected to the second terminal of the corresponding fuse, and a second electrode connected to the output terminal; and
   a second conductive transistor having a second electrode connected to the input terminal, a control electrode connected to the output terminal of the inverter, and a first electrode connected to the output terminal.

6. The fuse circuit of claim 5, wherein each of the transmission circuits further comprises a resistor having a first terminal that is connected to the control electrode of the first conductive transistor and to the input terminal of the inverter, and having a second terminal that is connected to a second power supply voltage.

7. The fuse circuit of claim 4, wherein the first power supply voltage is applied to the input terminal of the first in the series of the plurality of the transmission gates.

8. A fuse circuit storing information related to a semiconductor integrated circuit, comprising;
   a plurality of fuses each of which has first and second terminals, the first terminal of each being connected to a first power supply voltage, the fuses each storing predetermined information relevant to the semiconductor integrated circuit; and
   a like plurality of transmission circuits, each transmission circuit having a single input at an input terminal and a single output at an output terminal, a second terminal of each of the plurality of fuses being connected to only one corresponding transmission circuit of the plurality of transmission circuits, each transmission circuit transferring an input signal received at the input terminal to the output terminal in response to the predetermined information established by a status of the corresponding fuse,
   wherein the transmission circuits are connected in series, such that an input signal applied to the input terminal of a first transmission circuit in the series is transferred to the output terminal of a last transmission circuit in the series when all of the transmission circuits in the series are in an active state and such that the input signal is not transferred from the input terminal of the first transmission circuit to the output terminal of the last transmission circuit in the series when at least one of the transmission circuits in the series is in an inactive state.

9. The fuse circuit of claim 8, wherein the plurality of fuses in combination store one-bit of the predetermined information relevant to the semiconductor integrated circuit.

10. The fuse circuit of claim 8, wherein each of the transmission circuits comprises:

a transmission gate having an input terminal, an output terminal, a primary control terminal connected to the second terminal of a corresponding fuse, and a secondary control terminal; and an inverter having an input terminal connected to the second terminal of the corresponding fuse and the primary control terminal, and an output terminal connected to the secondary control terminal.

11. The fuse circuit of claim 10, wherein the transmission gate includes:

a NMOS transistor having a drain connected to the input terminal, a gate connected to the second terminal of the corresponding fuse, and a source connected to the output terminal; and a PMOS transistor having a source connected to the input terminal, a gate connected to the output terminal of the inverter, and a drain connected to the output terminal.

12. The fuse circuit of claim 11, wherein each of the transmission circuits further comprises a resistor having a first terminal that is connected to the control electrode of the NMOS transistor and the input terminal of the inverter, and having a second terminal that is connected to a second power supply voltage.

* * * * *